(12) United States Patent
Zang et al.

(10) Patent No.: US 9,876,010 B1
(45) Date of Patent: Jan. 23, 2018

(54) RESISTOR DISPOSED DIRECTLY UPON A SAC CAP OF A GATE STRUCTURE OF A SEMICONDUCTOR STRUCTURE

(71) Applicant: GLOBALFOUNDRIES Inc., Grand Cayman (KY)

(72) Inventors: Hui Zang, Guilderland, NY (US); Jagar Singh, Clifton Park, NY (US); Jerome Ciavatti, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/342,464

(22) Filed: Nov. 3, 2016

(51) Int. Cl.
*H01L 23/62* (2006.01)
*H01L 27/06* (2006.01)
*H01L 23/522* (2006.01)
*H01L 29/78* (2006.01)
*H01L 29/423* (2006.01)

(52) U.S. Cl.
CPC ...... *H01L 27/0629* (2013.01); *H01L 23/5226* (2013.01); *H01L 23/5228* (2013.01); *H01L 29/785* (2013.01); *H01L 29/4232* (2013.01); *H01L 2029/7858* (2013.01)

(58) Field of Classification Search
CPC ............. H01L 27/0629; H01L 27/0924; H01L 23/535; H01L 28/24; H01L 29/0653; H01L 29/66545; H01L 21/823821; H01L 21/823871; H01L 21/82378; H01L 29/41791; H01L 29/66772; H01L 29/66795; H01L 23/5226; H01L 23/5228; H01L 29/785; H01L 29/4232

USPC ................ 257/50, 358, 379, 288, 368, 369; 438/171, 190, 238, 151, 197, 199
See application file for complete search history.

(56) References Cited

U.S. PATENT DOCUMENTS

| 2016/0111425 A1* | 4/2016 | Chen ................... H01L 27/0922 257/369 |
| 2016/0204100 A1* | 7/2016 | Zhang ................. H01L 27/0629 257/369 |
| 2017/0062526 A1* | 3/2017 | Lu ....................... H01L 27/2463 |

OTHER PUBLICATIONS

U.S. Appl. No. 15/342,498, filed Nov. 3, 2016, titled Resistor and Capacitor Disposed Directly Upon a SAC Cap of a Gate Structure of a Semiconductor Structure.

* cited by examiner

*Primary Examiner* — Shahed Ahmed
(74) *Attorney, Agent, or Firm* — Heslin Rothenberg Farley & Mesiti P.C.; Nathan B. Davis

(57) ABSTRACT

A semiconductor structure includes a substrate. A gate structure is disposed over the substrate. The gate structure includes:
  a pair of gate spacers extending generally vertically from the substrate,
  gate metal disposed between the spacers, and
  a self-aligned contact (SAC) cap disposed over the gate metal to form a top of the gate structure.
A resistor is disposed directly upon the SAC cap such that no additional layer is disposed between the resistor and SAC cap. The resistor is composed of a material suitable to provide a predetermined resistance to a current to be conducted therethrough. A pair of resistor contacts are electrically connected to the resistor and spaced to provide the predetermined resistance to the current.

16 Claims, 8 Drawing Sheets

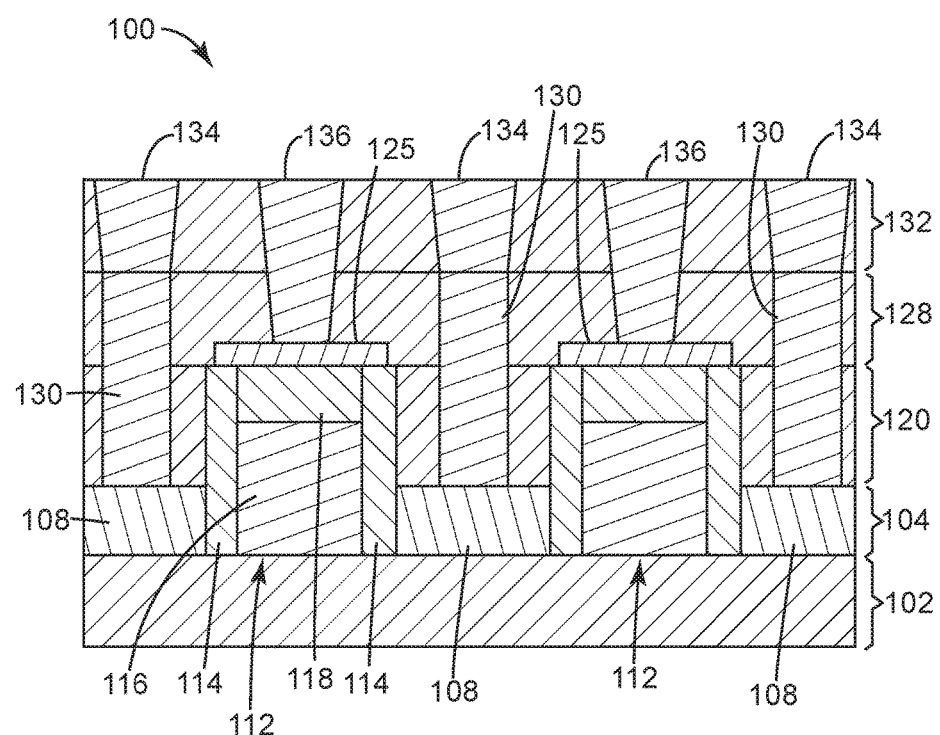

RESISTOR DISPOSED DIRECTLY UPON A SAC CAP OF A GATE STRUCTURE OF A SEMICONDUCTOR STRUCTURE

TECHNICAL FIELD

The present invention relates to semiconductor devices and methods of making the same. More specifically, the invention relates to resistors disposed directly upon a self-aligned contact (SAC) cap of a transistor gate in a semiconductor structure.

BACKGROUND

With constant down-scaling and increasingly demanding requirements to the speed and functionality of ultra-high density integrated circuits, the integration of resistors into prior art semiconductor structures becomes increasingly problematic. Resistors are most often integrated into a semiconductor structure during middle of the line (MOL) process flow. The MOL process flow generally includes those set of process steps used in the creation of the gate (CA) contacts and the source/drain (CB) contacts of transistors.

Prior art semiconductor structures require a dielectric layer disposed between the gate structure of the transistors and the resistors in order to prevent the resistors from electrically shorting to the gate. Problematically however, this increases the thickness of the dielectric layers in the MOL architecture, which exacerbates dimensional changes in width between the top and bottom of the CA and CB contacts. This is due to the fact that etching is never completely in a vertical direction. That is, any etching process (even an anisotropic RIE etch process) will always have some horizontal etch component to it. Accordingly, the top of a CA or a CB contact will always be larger than the bottom. The thicker the dielectric layers that must be etched through in order to form the CA and CB contacts, the greater the dimensional changes that will occur. These dimensional changes can have a negative effect on quality and reliability.

Also problematically in prior art semiconductor devices, the transistors and other like devices over which a resistor is disposed are rendered non-functional or disabled. This is because the resistor prevents any electrical connections from reaching the components disposed underneath them. So a Fin Field Effect Transistor (FinFET), for example, which can be made operational with CA contacts to its gate and CB contacts to its source/drain regions, is rendered non-functional if it is covered by a resistor that blocks such contacts from being made. Moreover, resistors generally have an increasingly large foot print and tend to cover larger number of devices with scaling due to the fact that their resistivity is fixed.

Accordingly, there is a need for a semiconductor structure that does not require a dielectric layer between resistors and gates in order to prevent electrical shorting. Additionally there is a need for a semiconductor structure wherein the resistors do not disable the components disposed below them.

BRIEF DESCRIPTION

The present invention offers advantages and alternatives over the prior art by providing various embodiments of a semiconductor structure having a resistor disposed directly over a SAC cap of a transistor gate. The invention improves the MOL process quality and reduces fabrication costs by eliminating at least one dielectric layer required relative to a conventional fabrication process of a resistor in a semiconductor structure. Additionally, in some embodiments, transistors disposed under a resistor formed in accordance with the present invention are functionally enabled as compared to prior art resistors which necessarily disable any transistors disposed thereunder.

A semiconductor structure in accordance with one or more aspects of the present invention includes a substrate. A gate structure is disposed over the substrate. The gate structure includes:
 a pair of gate spacers extending generally vertically from the substrate,
 gate metal disposed between the spacers, and
 a self-aligned contact (SAC) cap disposed over the gate metal to form a top of the gate structure.

A resistor is disposed directly upon the SAC cap such that no additional layer is disposed between the resistor and SAC cap. The resistor is composed of a material suitable to provide a predetermined resistance to a current to be conducted therethrough. A pair of resistor contacts are electrically connected to the resistor and spaced to provide the predetermined resistance to the current.

In another embodiment of the present invention a semiconductor structure includes a substrate having a plurality of fins extending longitudinally across. A plurality of transistors having source/drain regions are disposed within the fins and define channel regions therebetween. A plurality of gate structures are disposed over the channel regions and extend substantially perpendicular to the fins. The gate structures include:
 a pair of gate spacers extending generally vertically from the substrate,
 gate metal disposed between the spacers, and
 a SAC cap disposed over the gate metal.

A resistor is disposed directly upon at least one SAC cap of at least one transistor such that no additional layer is disposed between the resistor and the at least one SAC cap. The resistor is composed of a material suitable to provide a predetermined resistance to a current to be conducted therethrough. A pair of resistor contacts are electrically connected to the resistor and spaced to provide the predetermined resistance to the current.

DRAWINGS

The invention will be more fully understood from the following detailed description taken in conjunction with the accompanying drawings, in which:

FIG. 6 is an exemplary embodiment of a cross sectional view of the semiconductor structure of FIG. 5 having gate (CB) contacts and source/drain (CA) contacts disposed therein in accordance with the present invention;

Figure 8:
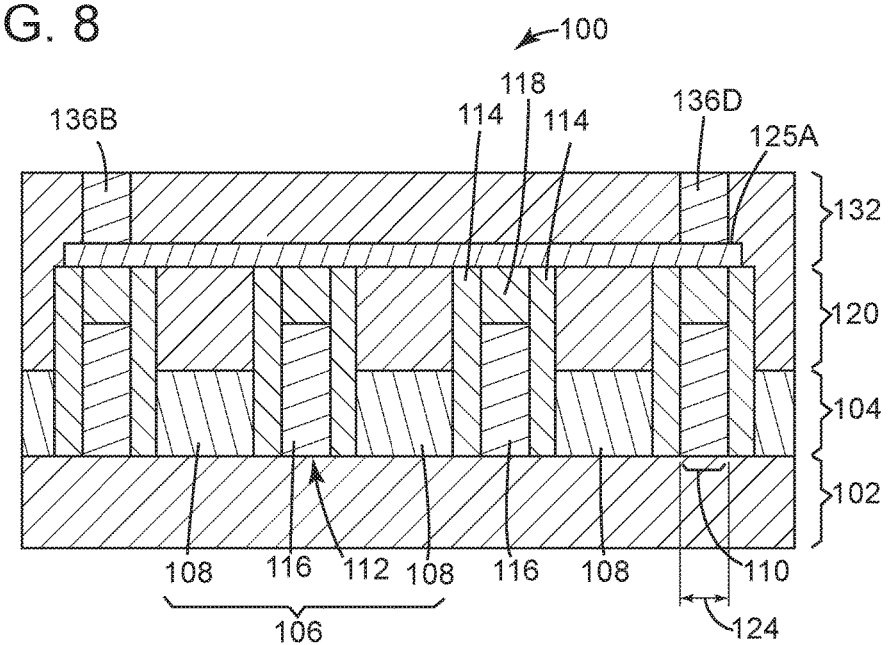
FIG. 8 is an exemplary embodiment of a cross sectional view of a semiconductor structure having gate structures with short channels and a resistor disposed directly over the SAC caps of the gate structures in accordance with the present invention.
Figure 9:
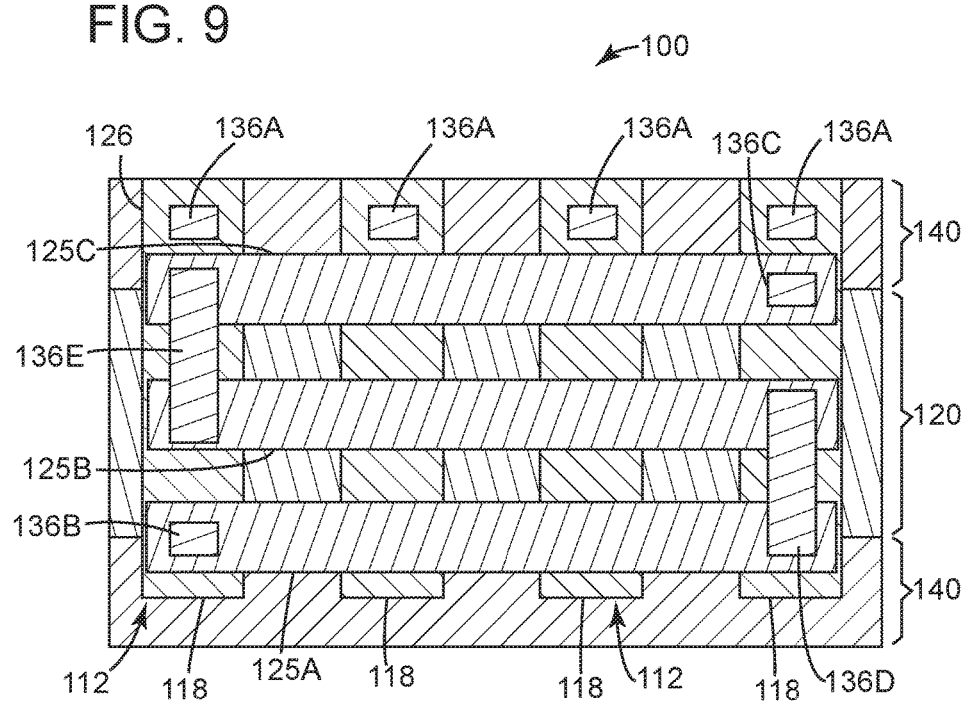
Figure 10:
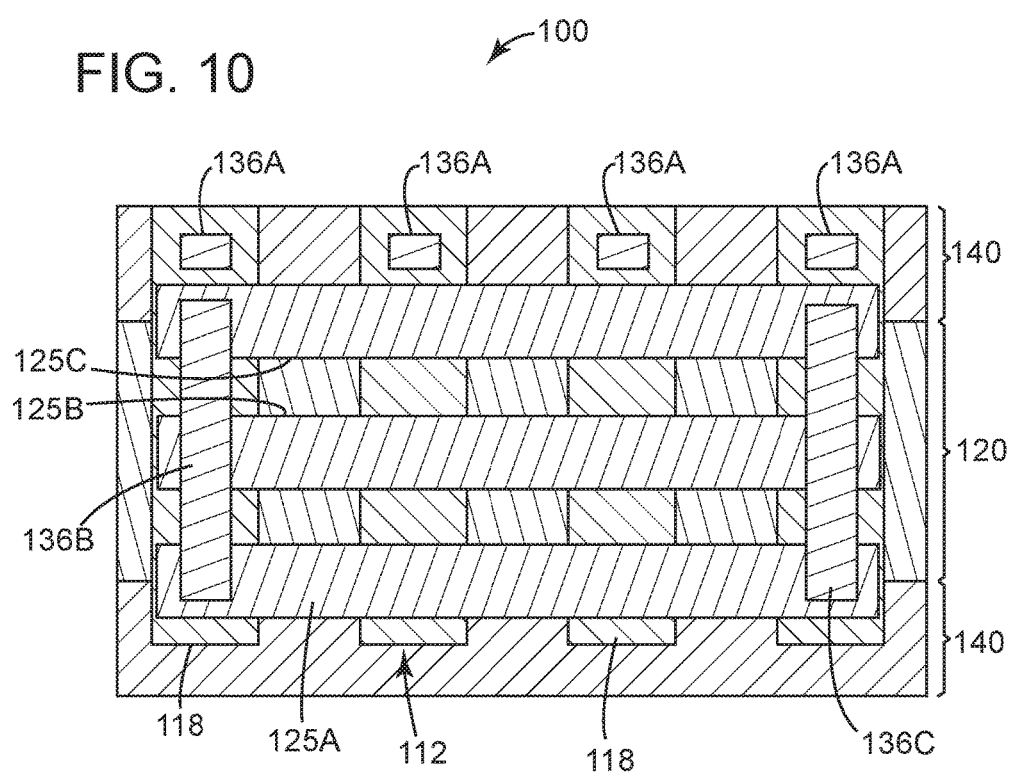

FIG. 9 is an exemplary embodiment of a top view of the semiconductor structure of FIG. 8, wherein the resistor is configured as a plurality of resistor strips connected in series in accordance with the present invention; and FIG. 10 is an exemplary embodiment of a top view of the semiconductor structure of FIG. 8, wherein the resistor is configured as a plurality of resistor strips connected in parallel in accordance with the present invention.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

Figure 1:
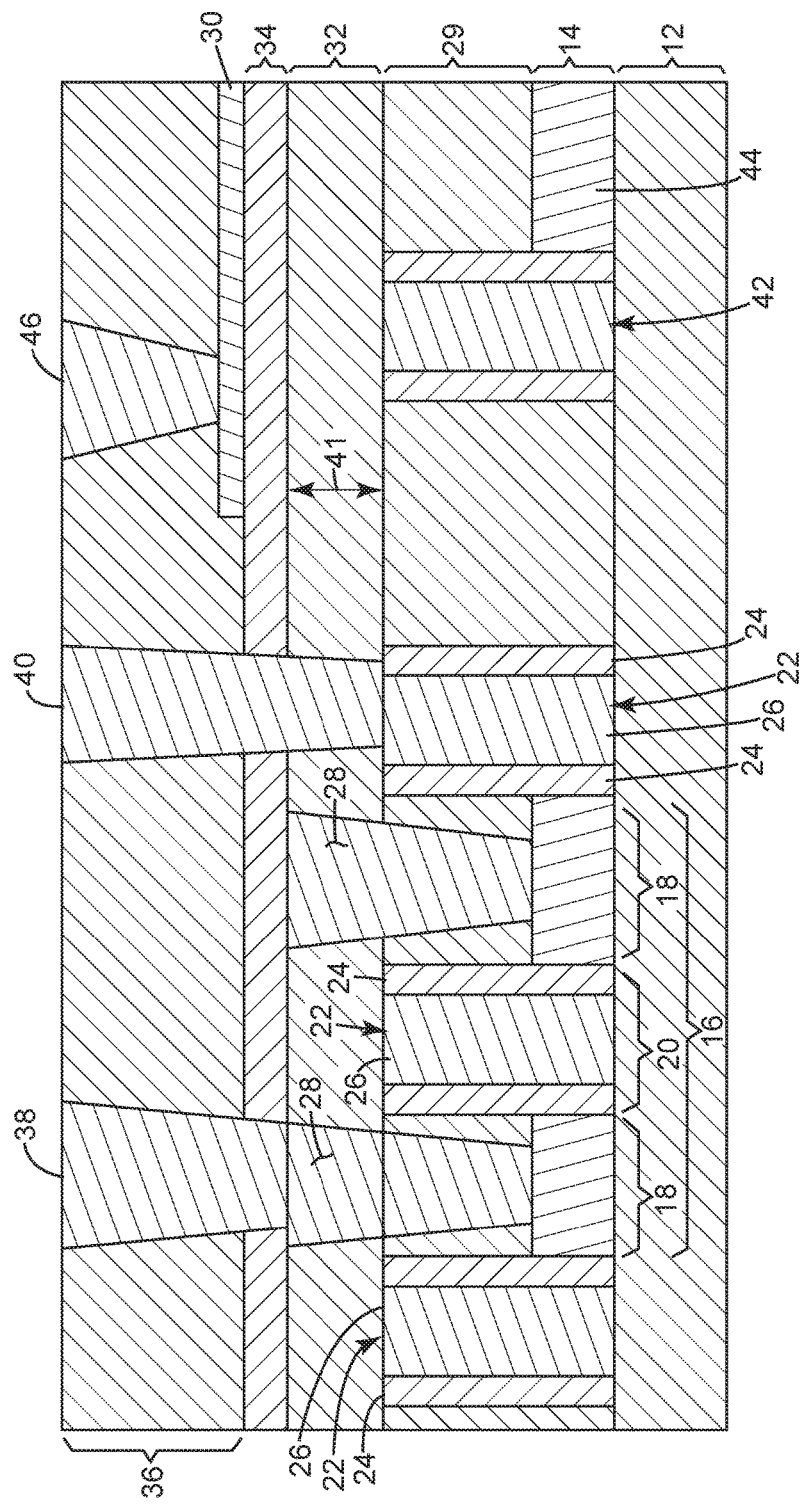
FIG. 1 is an exemplary embodiment of a prior art semiconductor structure.

FIG. 1 represents an exemplary embodiment of a prior art semiconductor structure with a resistor disposed in its MOL architecture. The resistor is separated from the gate structures below it by a dielectric layer in order to prevent an electrical shortage between gates and resistor.

FIGS. 2-10 illustrate various exemplary embodiments of a semiconductor structure in accordance with the present invention. The gate structures of the semiconductor structure have a self-aligned contact (SAC) cap disposed over the top of the gate metal within the gate structures. A resistor is disposed directly upon the SAC caps in accordance with the present invention. No additional dielectric layer is required to separate the resistor from the gate structures in order to prevent an electrical shortage between gates and resistor.

Referring to FIG. 1, an exemplary embodiment of a prior art semiconductor structure 10 is presented. Semiconductor structure 10 is in the 40 nm technology node. Semiconductor structure 10 includes a substrate 12 having a fin 14, which extends vertically upward from the substrate 12 and horizontally across the substrate 12. The fin 14 is one of a plurality of fins that extend longitudinally and substantially parallel across the substrate to define an active (Rx) region of the substrate 12.

Bordering the Rx region is an isolation region, such as a shallow trench isolation (STI) region, a deep trench isolation region or the like, that is used to separate the Rx region from various other active regions on semiconductor structure 10. The isolation region is typically composed of an amorphous dielectric material, such as a flowable oxide (FOX) or the like.

A plurality of Fin Field Effect Transistors (FinFETs) 16 are disposed within each of the fins 14. The FinFETs 16 each include a pair of source/drain (S/D) regions 18 disposed within the fin 14, which define a channel region 20 disposed therebetween and also within the fin 14.

A plurality of gate structures 22 are disposed over and around the portions of the fins 14 which are the channel regions 20 of transistor 16. The gate structures 22 extend substantially perpendicular to the fins 14 across the Rx region and may even extend into the isolation regions. The gate structures include:

a pair of gate spacers 24 extending generally vertically from the substrate 12, and gate metal 26 disposed between the spacers 24.

The gate spacers 24 are composed of a dielectric material such as SiN, SiNC, SiBCN or similar. The gate metal 26 is typically a stack of gate metals, which generally includes three main groups of structures (not shown). Those three main structures are: the gate dielectric layers (typically a high-k dielectric material), the work-function metal structures (typically TiN, TaN, TiCAl, other metal-nitrides or similar materials) and the gate electrode metal (typically Al, W, Cu or similar metal). The gate dielectric layers are used to electrically insulate the work-function metal structures and the gate electrodes from the substrate. The work-function metal structures are generally metal-nitrides that provide the work-function needed for proper FinFET operation, but typically have 10 to 100 times larger resistivity than the gate electrodes. The gate electrodes are metals, such as tungsten, with a very low resistivity.

Disposed over the S/D regions 18 and between the gate structures 22 is an inter-layer dielectric (ILD) layer 29, which is typically composed of an oxide such as SiO2. The ILD layer 29 extends upwards from the fins 14 to a level (i.e., vertical height above the substrate 12) that is substantially equal to the vertical height of the tops of the gate structures 24 relative to the substrate 12.

During process flow, the ILD layer 29 is planarized down to expose the tops of the gate structures 22. It is important to note that in this size technology node (e.g., 40 nm and greater), the tops of the gate structures 22 include the exposed gate metal 26.

Because the tops of the gate structures 22 in this prior art semiconductor structure 10 include exposed gate metal 26, any resistor, such as resistor 30, cannot be disposed at the same level as the gate structures 22 without undesirably shorting to the gate metal 26. As such, it is necessary to dispose a second dielectric layer 32, which is dedicated to separating and electrically isolating the resistor 30 from the tops of the gate structures 22. Over the dielectric layer 32 is deposited an etch stop layer 34, such as SiN or the like, that is required for the formation of resistor 30. Resistor 30 is then disposed over the etch stop layer 34 through well-known processes.

Trench Silicide (TS) layers 28 are disposed on opposing sides of the gate structures 22 and over the S/D regions 18. The TS layers extend vertically upward above the tops of the gate structure 22 to the level of the second dielectric layer 32. It is important to note that the tops of TS layers 28 must extend above the tops of the gate structure 22 for proper contact with the CA contacts. In that respect, the second dielectric layer serves a dual purpose of providing a second level for the top of the TS layers 28 and of providing electrical isolation between the resistor 30 and the gate metal 26. It is also important to note that if the requirement for electrical isolation between resistor 30 and gate metal 26 were removed, then the second dielectric layer 32 could be made thinner (for example as much as 20 nm thinner or more in this embodiment).

The TS layers 28 may be disposed by a process of TS metallization. The TS metallization process may include formation of a bottom silicide layer over the S/D regions 18 followed by deposition of a top conducting metal layer. The bottom silicide layer may be composed of Ni, Ti, NiPt silicide or the like. The conducting metal layer may be composed of TiN, TaN and bulk conducting materials such as W, Co or Ru. The TS layers 28 extend substantially parallel to the gate structures 22 across the entire Rx region in order to ensure proper electrical contact with the S/D regions 18 of FinFETs 16 even under worst case misalignment conditions.

Disposed over the semiconductor structure 10, including over the second dielectric layer 32, etch stop layer 34, and resistor 30 is an oxide fill layer (or third dielectric layer) 36. During process flow, the oxide fill layer 36 is used for patterning, etching and forming the source/drain (CA) contacts 38 and the gate (CB) contacts 40. The CA contacts 38 are etched down to land on the TS layers 28 to make electrical contact to the S/D regions 18 of transistors 16. The CB contacts 40 are etched down to make electrical contact with the gate metal 26 of gate structures 22.

Note that in this prior art semiconductor structure 10, the thickness 41 of the second dielectric layer 32 has added extra depth that must be etched through in order to land on target. This makes it more difficult to form proper electrical continuity from the CA contacts 38, through the TS layers 28, and to the S/D regions 18. Additionally it makes it more difficult to form proper electrical continuity between the CB contacts 40 and the gate metal 26. Further, this added depth increases the dimensional changes from top to bottom of the CA contacts, CB contacts and TS layers 28. Accordingly, if the thickness 41 can be reduced, then quality and reliability can be improved.

Also problematically, any devices located below the resistor 30 is rendered inoperative. For example, in this embodiment, gate structure 42 and S/D region 44 are located directly below resistor 30. However, the resistor 30 prevents any contacts, such as contact 46, from reaching either gate structure 42 or S/D region 44 in order to electrically enable them. Therefore both gate structure 42 and S/D region 44 are inoperative.

Figure 2:
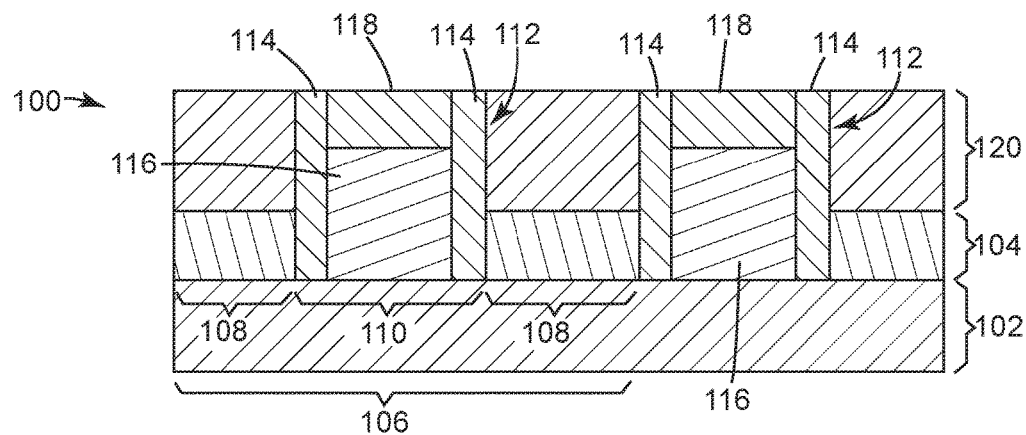
FIG. 2 is an exemplary embodiment of a simplified cross sectional view of a semiconductor structure at an intermediate stage of manufacture in accordance with the present invention.

Referring to FIG. 2, an exemplary embodiment of a simplified side view of a semiconductor structure 100 in accordance with the present invention is presented at an intermediate stage of manufacturing. Semiconductor structure is in the 10 nm technology node. At this stage of the process flow, semiconductor structure 100 includes a substrate 102 having a fin 104, which extends vertically upward from the substrate 102 and horizontally across the substrate 102. The fin 104 is one of a plurality of fins that extend longitudinally and substantially parallel across the substrate to define an active (Rx) region 138 (best seen in FIG. 7A) of the substrate 102.

Bordering the Rx region is an isolation region 140 (best seen in FIG. 7A), such as a shallow trench isolation (STI) region, a deep trench isolation region or the like, that is used to separate the Rx region from various other active regions on semiconductor structure 100. The isolation region is typically composed of an amorphous dielectric material, such as a flowable oxide (FOX) or the like.

A plurality of Fin Field Effect Transistors (FinFETs) 106 are disposed within each of the fins 104. The FinFETs 106 each include a pair of source/drain (S/D) regions 108 disposed within the fin 104, which define a channel region 110 disposed therebetween and also within the fin 104.

A plurality of gate structures 112 are disposed over the substrate 102 and around the portions of the fins 104 which are the channel regions 110 of transistor 106. The gate structures 112 extend substantially perpendicular to the fins 104 across the Rx region 138 and may even extend into the isolation regions 140. The gate structures include:
a pair of gate spacers 114 extending generally vertically from the substrate 102,
gate metal 116 disposed between the spacers 114, and
a self-aligned contact (SAC) cap 118 disposed over the gate metal 116 to form a top of the gate structure 112.

The gate spacers 114 are composed of a dielectric material such as SiN, SiNC, SiBCN or similar. The gate metal 26 is typically a stack of gate metals, which generally includes the gate dielectric layers (typically a high-k dielectric material), the work-function metal structures (typically TiN, TaN, TiCAl, other metal-nitrides or similar materials) and the gate electrode metal (typically Al, W, Cu or similar metal). The SAC caps 118 are also a dielectric material that is similar, if not identical, to the material of the gate spacers 114.

In contrast to the semiconductor structure 10 of FIG. 1, which is a significantly larger technology node (in this embodiment, the 40 nm technology node), the smaller semiconductor structure 10 of FIG. 2 (within the 10 nm technology node in this embodiment) requires SAC caps 118 over the gate metal 116. This is because, with scaling to ultra-small dimensions, the TS layers 130 (best seen in FIG. 5) and gate structure 112 come very close to each other or may even touch. Therefore, without the SAC caps 118, the TS layers 130 have an unacceptably high probability of shorting to the gate metal 116. A typical size range where such SAC caps 118 are utilized would be in semiconductor structures that have a fin to fin pitch of 45 nm or less, or even 35 nm or less. Another typical size range in which SAC caps are used is where the distance from gate center to gate center is 68 nm or less.

The SAC caps 118 are typically formed by first recessing the gate metal 116 below the level of the top of the gate structure 112. However, the gate spacers 114 are not typically recessed. Thereafter, a layer of SAC cap material, such as SiN or SiNC, is disposed over the semiconductor structure 100 and within the recessed top of the gate structure 112. Next the SAC cap layer is planarized down to self-align the SAC caps 118 to the edges of the gate spacers 114.

The SAC caps 118 and the gate spacers 114 now completely enclose and electrically isolate the gate metal 116 from the TS layers 130. Advantageously, the SAC caps 118 also provide added real estate within the semiconductor structure 100 for various novel embodiments of a resistor 124 (best seen in FIG. 4) without the need for a second dielectric layer (such as prior are dielectric layer 32 of FIG. 1) to provide electrical isolation between the resistor 124 and the gate metal 116.

Disposed over the S/D regions 108 and between the gate structures 112 is an inter-layer dielectric (ILD) layer 120, which is typically composed of an oxide such as SiO2. The ILD layer 120 extends upwards from the fins 104 to a level (i.e., vertical height above the substrate 102) that is substantially equal to the vertical height of the tops of the gate structures 112.

Figure 3:
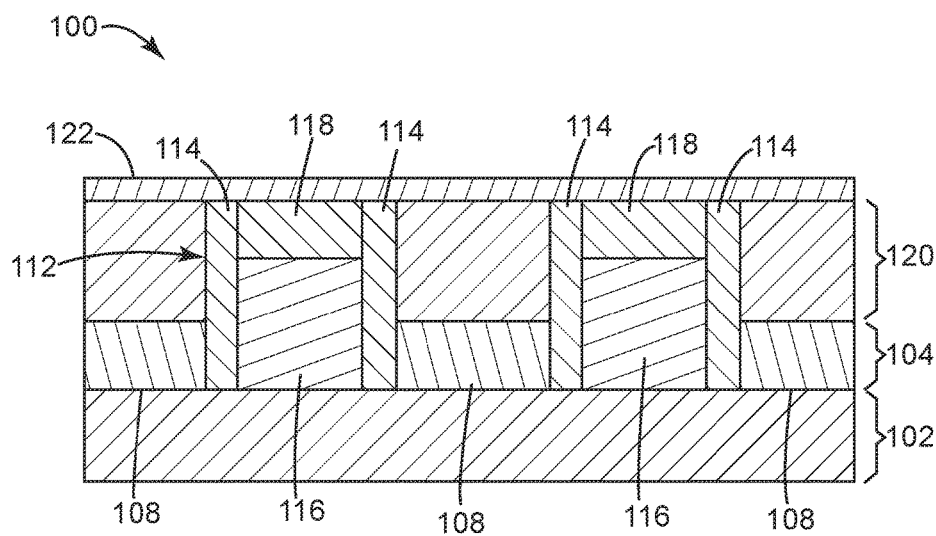
FIG. 3 is an exemplary embodiment of a cross sectional view of the semiconductor structure of FIG. 2 having a resistor layer disposed directly upon SAC caps of gate structures in accordance with the present invention.

Referring to FIG. 3, next in the process flow a resistor layer 122 is disposed over the semiconductor structure 100. The resistor layer 122 is disposed directly over the SAC caps such that no additional layer (such as prior art dielectric layer 32 of FIG. 1) is disposed between the resistor layer 122 and the SAC cap.

The resistor layer 122 may be composed of any material suitable to provide a predetermined resistance to a current that will be conducted through the resistor material after formation. Such material may be a silicide such as a tungsten silicide, a metal such as aluminum or other suitable material.

Figure 4:
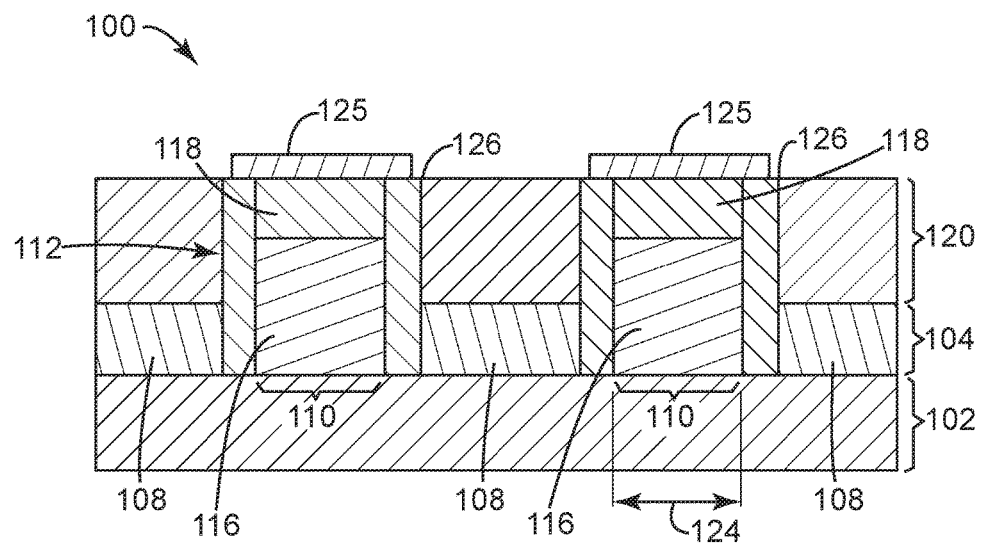
FIG. 4 is an exemplary embodiment of a cross sectional view of the semiconductor structure of FIG. 3 having resistors disposed directly over the SAC caps of long channel gate structures in accordance with the present invention.

Referring to FIG. 4, an exemplary embodiment of a long channel gate structure 112 is presented. For purposes herein, the channel height 124 of the channels 110 (i.e., the horizontal distance across the gate metal 116) can be classified as either long or short. A short channel 110 herein is one where its channel height 124 is 30 nm or less. A long channel 110 herein is one where its channel height 124 is 80 nm or greater.

In the long channel embodiment of FIG. 4, the gate structure 112 is large enough to lithographically pattern and etch the resistor layer 122 to form resistors 125 that are fully within a perimeter of the top of the gate structure 112. That is, the top of the gate structure 112 has a perimeter 126 which defines the top boarders of the gate structure 112. In a long channel gate structure 112, that perimeter 126 is large enough to be within the capabilities of conventional lithography to pattern the resistor layer 122 such that the formed resistors 125 are disposed entirely within that perimeter 126. Note that the resistor 122 and gate metal 116 are electrically isolated from each other by the SAC cap 118.

Figure 5:
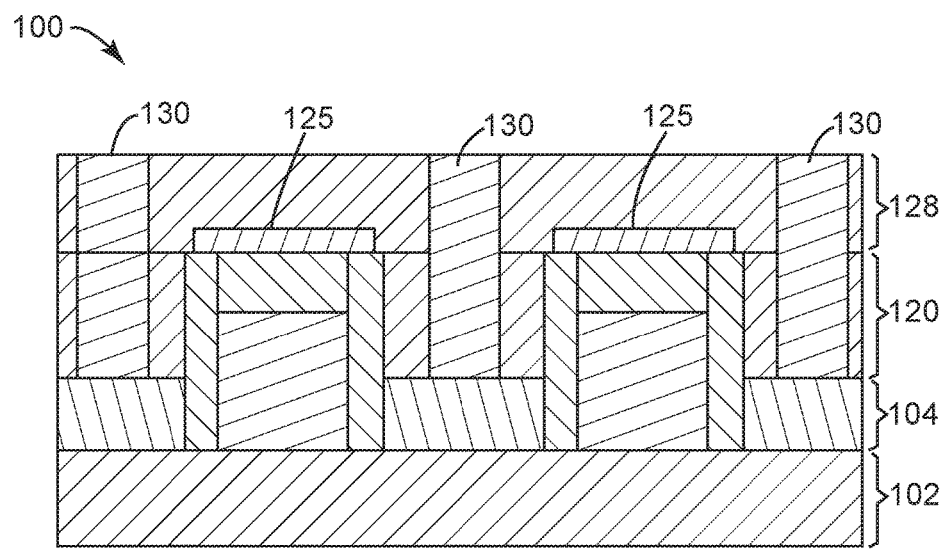
FIG. 5 is an exemplary embodiment of a cross sectional view of the semiconductor structure of FIG. 4 having trench silicide (TS) layers disposed thereon in accordance with the present invention.

Referring to FIG. 5, a second dielectric layer 128 is disposed over the structure 100. The second dielectric layer provides a second level, higher than the tops of the gate structures 112. The TS layers 130 are then formed, wherein they extend from the S/D regions 108 to the top of the second dielectric layer 128. It is important to note that the second dielectric layer 128 does not have to provide functional electrical isolation between the resistor 125 and the gate metal 116. That function is provided by the SAC cap 118. As such, the second dielectric layer 128 can be made thinner than prior art dielectric layers (such as dielectric layer 32 of FIG. 1). For example, in this embodiment, dielectric layer 128 can be as much as 20 nm thinner than prior art dielectric layer 32. Accordingly, the TS layers 130 of FIG. 5 can be formed with less variations in width between their tops and bottoms relative to prior art TS layers 28 of FIG. 1.

Referring to FIG. 6, next an oxide fill layer 132 is disposed over the semiconductor structure 100, including the second dielectric layer 128 and TS layers 130. During process flow, the oxide fill layer 132 is used for patterning, etching and forming the source/drain (CA) contacts 134 and the gate (CB) contacts 136. The CA contacts 134 are etched down to land on the TS layers 130 to make electrical contact to the S/D regions 108. The CB contacts 136 are etched down to make electrical contact with the resistors 125.

Figure 7B:
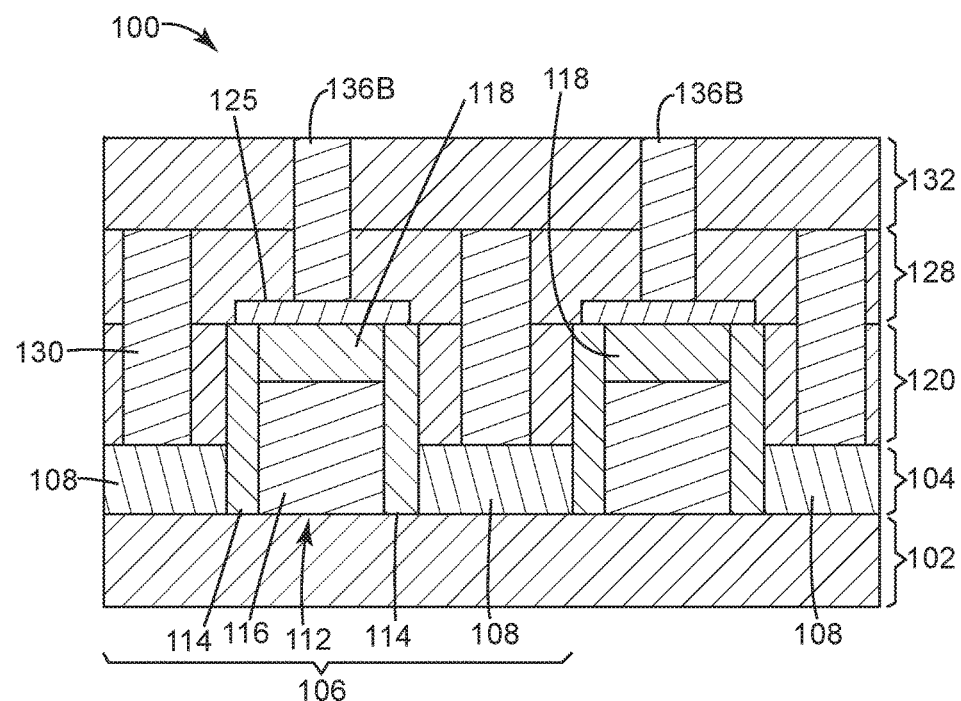
FIG. 7B is a cross sectional view of FIG. 7A taken along the line 7B-7B in accordance with the present invention.
Figure 7A:
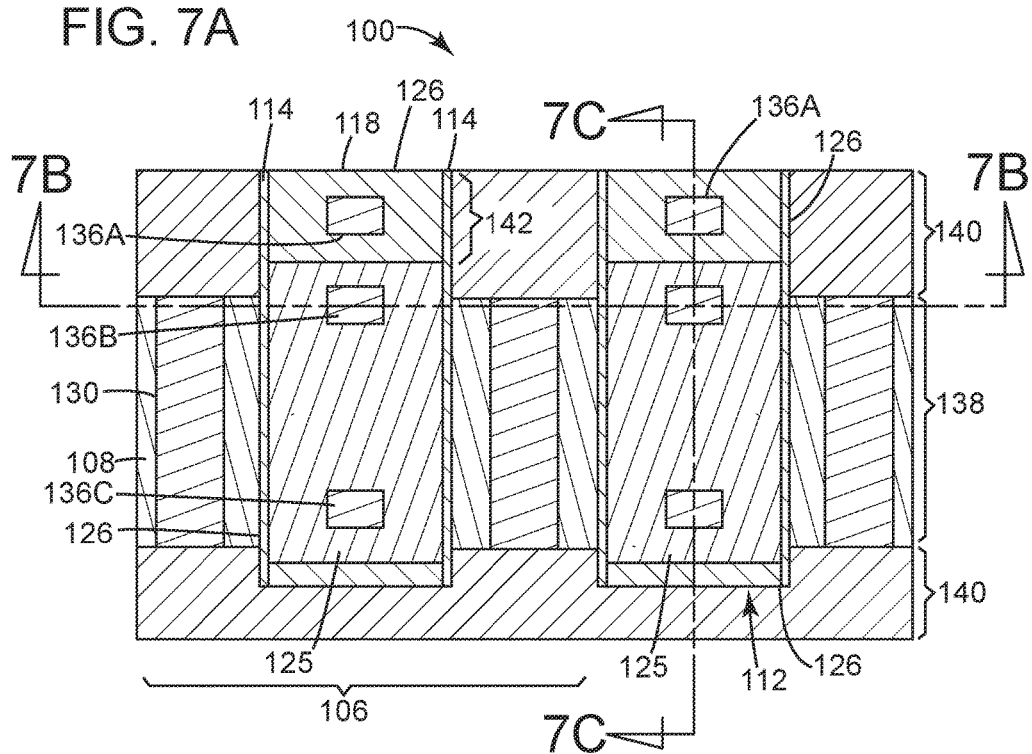
FIG. 7A is an exemplary embodiment of a top view of the semiconductor structure of FIG. 6 without the CA contacts in accordance with the present invention.

Referring to FIG. 7A, a top view of the semiconductor structure 100 of FIG. 6 is presented without the CA contacts 134 being shown. Because the gate structure 112 has a long channel 116, the perimeter 126 of the top of the gate structure 112 is large enough to lithographically pattern the resistors 125 such that they are disposed entirely within that perimeter 126. It is important to note that because the resistor 125 is disposed exclusively within the perimeter 126, that resistor does not extend over any of the TS layers 130. Therefore, the CA contacts 134 (best seen in FIG. 6) to those TS layers 130 are not blocked by the resistor 125 and the S/D regions 108 of transistor 106 can be electrically enabled.

The Rx region 138 is defined by the array of fins 104 which extend longitudinally and substantially parallel across the semiconductor structure 100. It is within the Rx region 138 that the source/drain regions 108 and channel regions 110 are embedded. Outside of the Rx region 138 is the isolation region 140 wherein no semiconductor devices are disposed.

During process flow, a pair of resistor contacts 136 B and 136C are targeted to land on resistor 125 to provide an electrical connection to the resistor 125. The resistor contacts 136B and 136C are spaced to provide a predetermined resistance to a current. That is, the contacts 136B and 136B are spaced a specific distance apart such that when a known current is conducted from one contact (136B for example), through the resistor 125, and into the other contact (136C for example), then the resistivity of the resistor material, as well as the geometry of the resistor 125, will provide a predetermined resistance to that current.

In this embodiment, a portion 142 of the 112 that is not covered by resistor 125 is extended over the isolation region 140. Gate (CB) contact 136A lands on that extended portion 142.

Referring to FIG. 7B, a cross sectional view of FIG. 7A taken along the line 7B-7B is presented. The resistor contacts 136B and 136C extend at least up to the level of oxide fill layer 132.

Figure 7C:
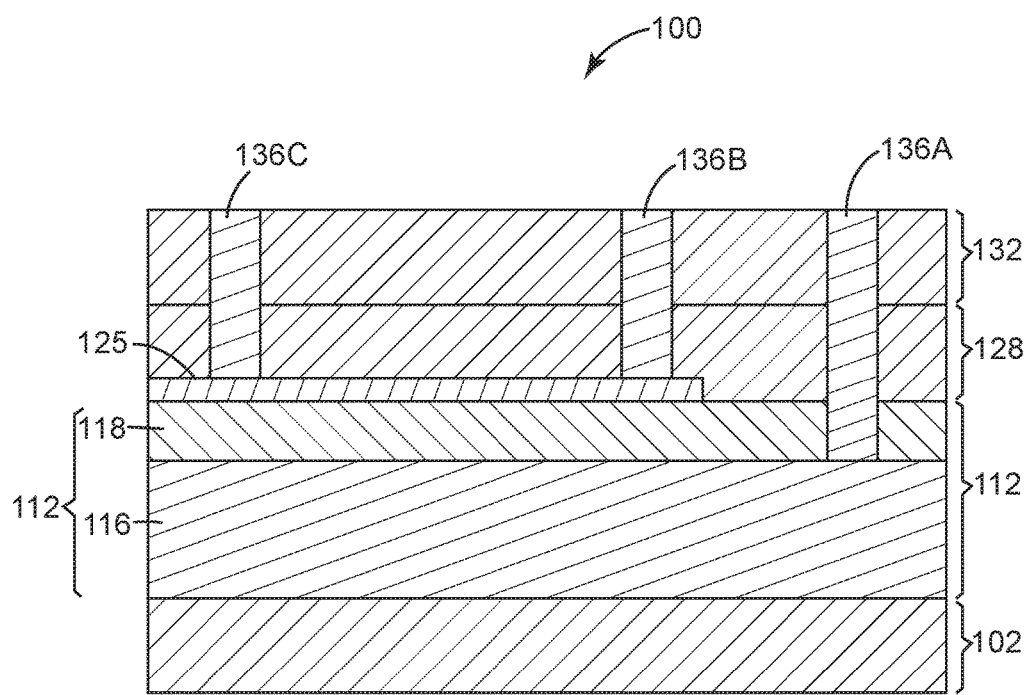
FIG. 7C is a cross sectional view of FIG. 7A taken along the line 7C-7C in accordance with the present invention.

Referring to FIG. 7C, the CB contact 136A penetrates the SAC cap 118 and is electrically connected to the gate metal 116 of the portion 142 of the gate structure 112 not covered by the resistor 125. Accordingly, the CB contact 136A electrically enables the gate structure 112 to operably control the channel regions 110 of the transistor 106.

It is important to note, that transistor 106 is fully functional even though it is disposed directly under resistor 125. This is because the resistor 125 does not extend over the TS layers 130 to block the CB contacts from electrically connecting to the S/D regions 108 and because the gate structure 112 is electrically enabled by CA contact 136A, which is disposed over the isolation region 140. This is in direct contrast to prior art semiconductor structure 10 of FIG. 1, wherein the transistors and other devices located under its resistor 30 are disabled because the resistor blocks the electrical contacts 46 from reaching those devices.

Referring to FIG. 8, a side view of an exemplary embodiment of semiconductor structure 100 having a short channel 110 is presented. In this case, the channel 110 has a channel height 124 that is 30 nm or less.

In this short channel embodiment, the gate structure 112 is too small to lithographically pattern and etch the resistor layer 122 to form resistors 125 that are fully within the perimeter 126 of the top of the gate structure 112. That is, the resistor 125 must necessarily extend outside of perimeter 126 and over the S/D regions 108 of transistor 106. As such, the resistor 125 blocks the formation of TS layers 130 and source/drain contacts 134.

Referring to FIG. 9, a top view of FIG. 8 is presented wherein the resistor 125 is configured as a plurality of resistor strips 125A, 125B and 125C connected in series between the resistor contacts 136B and 136C. In this embodiment, the resistor 125 includes three strips 125A, 125B and 125C. The strips 125A, 125B, 125C extend substantially parallel across the Rx region 120 over the SAC caps 118 of the gate structures 112. A resistor contact 136D connects a pair of distal ends of resistor strips 125A and 125B together in an electrical series connection. Another resistor contact 136E connects an opposing pair of distal ends of resistor strips 125B and 126C in a series connection as well. As such, the resistance of each resistor strip adds together. For example, if each resistor strip 125A, 125B and 125C were equal to 100 ohms each, the total resistance of resistor 125 would equal 300 ohms.

Referring to FIG. 10, a top view of FIG. 8 is presented wherein the resistor 125 is configured as a plurality of resistor strips 125A, 125B and 125C connected in parallel between the resistor contacts 136B and 136C. In this embodiment, the resistor strips 125A, 125B, 125C extend substantially parallel across the Rx region 120 over the SAC caps 118 of the gate structures 112. The resistor contact 136B connects three distal ends of the resistor strips 125A, 125B and 125C together in an electrical parallel connection. The other resistor contact 136C connects an opposing three distal ends of resistor strips 125B, 126B and 125C in a parallel connection as well. As such, the resistance of each resistor strip are divided down together. For example, if each resistor strip 125A, 125B and 125C were equal to 100 ohms each, the total resistance of resistor 125 would equal 33.3 ohms.

It is important to note, that in the short channel embodiments of semiconductor structure 100 illustrated in FIG. 8-10, the resistor 125 blocks the formation of electrical contacts between CA contacts 134 and the S/D regions 108. However, it is also important to note that the short channel embodiments of semiconductor structure 100 also eliminate the requirement for a dielectric layer (such as prior art dielectric layer 32 of FIG. 1) disposed between the resistor 125 and the gate metal 116. This is because, the resistor 125 is disposed directly upon the SAC cap 118, which serves to electrically isolate the resistor 125 from the gate metal 116.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A semiconductor structure comprising:
a substrate;
a gate structure disposed over the substrate, the gate structure including:
a pair of gate spacers extending generally vertically from the substrate,
a gate metal disposed between the spacers, and
a self-aligned contact (SAC) cap disposed over the gate metal to form a top of the gate structure, the top of the gate structure having a perimeter;
a resistor disposed directly upon the SAC cap such that no additional layer is disposed between the resistor and SAC cap, the resistor being composed of a material suitable to provide a predetermined resistance to a current to be conducted therethrough, and wherein the resistor extends outside of the perimeter and over a source/drain region of a transistor; and
a pair of resistor contacts electrically connected to the resistor and spaced to provide the predetermined resistance to the current.

2. The semiconductor structure of claim 1 comprising:
the transistor including:
the pair of source/drain regions disposed within the substrate and defining a channel region therebetween, and
the gate structure, wherein the gate metal is disposed over the channel region.

3. The semiconductor structure of claim 2 comprising the channel having a channel height that is 80 nm or greater.

4. The semiconductor structure of claim 1 comprising: a portion of the gate structure not covered by the resistor; and a gate (CB) contact which penetrates the SAC cap and is electrically connected to the gate metal of the portion of the gate structure not covered by the resistor; wherein the CB contact enables the gate structure to operably control the channel region of the transistor.

5. The semiconductor structure of claim 4 wherein the portion of the gate structure not covered by the resistor extends over an isolation region of the semiconductor structure.

6. The semiconductor structure of claim 1 comprising the channel having a channel height that is 30 nm or less.

7. The semiconductor structure of claim 1 comprising: the substrate including a plurality of substantially parallel fins extending longitudinally across the substrate; the transistor including a plurality of transistors disposed within the fins; the gate structure including a plurality of gate structures extending substantially perpendicular to the fins; and wherein the resistor extends substantially parallel to the fins and over a plurality of source/drain regions.

8. The semiconductor structure of claim 7 wherein the resistor comprises a plurality of resistor strips connected in series between the resistor contacts.

9. The semiconductor structure of claim 7 wherein the resistor comprises a plurality of resistor strips connected in parallel between the resistor contacts.

10. A semiconductor structure comprising:
a substrate including a plurality of fins extending longitudinally across;
a plurality of transistors having source/drain regions disposed within the fins and defining channel regions therebetween;
a plurality of gate structures disposed over the channel regions and extending substantially perpendicular to the fins, the gate structures including:
a pair of gate spacers extending generally vertically from the substrate,
a gate metal disposed between the spacers, and
a self-aligned contact (SAC) cap disposed over the gate metal, the at least one SAC cap forming a top of the gate structure of the at least one transistor, the gate top having a perimeter;
a resistor disposed directly upon at least one SAC cap of at least one transistor such that no additional layer is disposed between the resistor and the at least one SAC cap, the resistor being composed of a material suitable to provide a predetermined resistance to a current to be conducted therethrough, wherein the resistor extends outside of the perimeter and over a source/drain region of the at least one transistor; and
a pair of resistor contacts electrically connected to the resistor and spaced to provide the predetermined resistance to the current.

11. The semiconductor structure of claim 10 comprising the channel region of the at least one transistor over which the at least one SAC cap is disposed having a channel height that is 80 nm or greater.

12. The semiconductor structure of claim 10 comprising:
- a portion of the gate structure of the at least one transistor, upon which the resistor is disposed, is not covered by the resistor; and
- a gate (CB) contact which penetrates the at least one SAC cap and is electrically connected to the gate metal of the portion of the gate structure not covered by the resistor;
- wherein the CB contact enables the gate structure to operably control the channel region of the at least one transistor.

13. The semiconductor structure of claim 12 wherein the portion of the gate structure not covered by the resistor extends over an isolation region of the semiconductor structure.

14. The semiconductor structure of claim 10 comprising the channel region of the at least one transistor over which the at least one SAC cap is disposed having a channel height that is 30 nm or less.

15. The semiconductor structure of claim 10 wherein the resistor comprises a plurality of resistor strips connected in series between the resistor contacts.

16. The semiconductor structure of claim 10 wherein the resistor comprises a plurality of resistor strips connected in parallel between the resistor contacts.

* * * * *